(12) United States Patent
Hirai et al.

(10) Patent No.: US 10,321,609 B2
(45) Date of Patent: Jun. 11, 2019

(54) COOLING SYSTEM AND METHOD OF COOLING ELECTRONIC DEVICE

(71) Applicant: FUJITSU LIMITED, Kawasaki-shi, Kanagawa (JP)

(72) Inventors: Keita Hirai, Kawasaki (JP); Tsuyoshi So, Kawasaki (JP); Naofumi Kosugi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/787,757

(22) Filed: Oct. 19, 2017

(65) Prior Publication Data

US 2018/0153058 A1   May 31, 2018

(30) Foreign Application Priority Data

Nov. 28, 2016 (JP) .................................. 2016-229725

(51) Int. Cl.
*H05K 7/20* (2006.01)
(52) U.S. Cl.
CPC ..... *H05K 7/20781* (2013.01); *H05K 7/20236* (2013.01)
(58) Field of Classification Search
CPC ................................................. H05K 7/20781
See application file for complete search history.

(56) References Cited

U.S. PATENT DOCUMENTS

| 2,886,746 | A | * | 5/1959 | Saby | ................... | F28D 15/0233 |
| | | | | | | 165/104.29 |
| 4,271,681 | A | * | 6/1981 | Schertz | ..................... | F25D 3/04 |
| | | | | | | 165/104.11 |
| 4,572,286 | A | * | 2/1986 | Fujii | ..................... | F25B 23/006 |
| | | | | | | 165/104.19 |
| 4,970,868 | A | * | 11/1990 | Grebe | ................... | H01L 23/427 |
| | | | | | | 257/E23.088 |
| 5,021,924 | A | * | 6/1991 | Kieda | ................. | H01L 23/4336 |
| | | | | | | 165/104.33 |
| 5,048,598 | A | * | 9/1991 | Takemae | ............ | H05K 7/20272 |
| | | | | | | 137/597 |
| 5,270,572 | A | * | 12/1993 | Nakajima | ........... | H01L 23/4735 |
| | | | | | | 165/104.33 |

(Continued)

FOREIGN PATENT DOCUMENTS

EP   3188580   7/2017
JP   05-322459   12/1993

(Continued)

*Primary Examiner* — James Wu
*Assistant Examiner* — Michael A Matey
(74) *Attorney, Agent, or Firm* — Fujitsu Patent Center (57) ABSTRACT

A cooling system includes an immersion tank that includes a liquid coolant sealed therein, a housing that includes through-holes formed in a top portion and a bottom portion thereof, respectively, and disposed within the immersion tank, an electronic device disposed in the housing in a state of being immersed in the coolant, a coolant flow path formed between an inner surface of the immersion tank and an outer surface of the housing to couplet he through-hole in the top portion of the housing to the through-hole in the bottom portion of the housing so that the coolant flows therethrough, and a heat transfer member that transports heat of the coolant in the coolant flow path to an outside of the immersion tank.

8 Claims, 9 Drawing Sheets

(56) References Cited

U.S. PATENT DOCUMENTS

| | | | | |
|---|---|---|---|---|
| 5,508,908 A * | 4/1996 | Kazama | ............ | H05K 7/20936 165/80.3 |
| 5,959,351 A * | 9/1999 | Sasaki | ............ | F15D 1/08 257/714 |
| 6,360,559 B1 * | 3/2002 | Midorikawa | ...... | H05K 7/20272 165/104.33 |
| 7,092,254 B1 * | 8/2006 | Monsef | ............ | H01L 23/473 165/80.4 |
| 7,505,269 B1 * | 3/2009 | Cosley | ............ | F28D 15/02 165/104.33 |
| 9,681,589 B1 * | 6/2017 | Ross | ............ | H05K 7/208 |
| 9,887,146 B2 * | 2/2018 | Flotta | ............ | H01L 23/4735 |
| 2007/0158052 A1 * | 7/2007 | Lin | ............ | H01L 23/427 165/104.33 |
| 2008/0141875 A1 * | 6/2008 | Fahrenback | ............ | H01G 2/08 100/341 |
| 2009/0294106 A1 * | 12/2009 | Flotta | ............ | H01L 23/4735 165/104.33 |
| 2011/0132579 A1 * | 6/2011 | Best | ............ | H05K 7/20763 165/104.31 |
| 2012/0057302 A1 * | 3/2012 | Wei | ............ | H05K 7/20781 361/699 |
| 2015/0382511 A1 | 12/2015 | James et al. | | |
| 2016/0019990 A1 * | 1/2016 | Mochizuki | ............ | G21C 19/07 376/299 |
| 2016/0330865 A1 * | 11/2016 | Mathew | ............ | H05K 7/20236 |
| 2017/0064862 A1 * | 3/2017 | Miyoshi | ............ | H05K 7/203 |
| 2017/0150649 A1 * | 5/2017 | Chester | ............ | H05K 7/20772 |
| 2017/0303442 A1 * | 10/2017 | Smith | ............ | H05K 7/20809 |
| 2017/0311484 A1 * | 10/2017 | Ozyalcin | ............ | H05K 7/20645 |
| 2018/0042138 A1 * | 2/2018 | Campbell | ............ | H05K 7/20318 |

FOREIGN PATENT DOCUMENTS

| | | |
|---|---|---|
| WO | 2016/003779 | 1/2016 |
| WO | 2016/031781 | 3/2016 |

* cited by examiner

COOLING SYSTEM AND METHOD OF COOLING ELECTRONIC DEVICE

CROSS-REFERENCE TO RELATED APPLICATION

This application is based upon and claims the benefit of priority of the prior Japanese Patent Application No. 2016-229725, filed on Nov. 28, 2016, the entire contents of which are incorporated herein by reference.

FIELD

The embodiments discussed herein are related to a cooling system and a method of cooling an electronic device.

BACKGROUND

With the arrival of an advanced information society, the necessity of a data center is increasing more and more. In the data center, a large number of racks are installed in a room, and electronic devices such as, for example, servers or storage devices are accommodated in the respective racks so that these electronic devices are collectively managed.

Incidentally, as the performance of electronic devices has been improved, the calorific values of the electronic devices have been increased. When electronic devices having a large calorific value are mounted at a high density, the temperature of the electronic devices exceeds the allowable upper limit temperature, which causes malfunctions, failures, or a reduction in processing capability. Therefore, there is a demand for a cooling method that is capable of sufficiently cooling electronic devices having a large calorific value even if the electronic devices are mounted at a high density.

As the cooling method, it has been proposed to cool an electronic device by immersing the electronic device in a liquid coolant. Hereinafter, this type of cooling method is called an immersion cooling method. In the immersion cooling method, a liquid coolant (e.g., a fluorine compound), which is inert and has high insulation, is introduced into an immersion tank and an electronic device is immersed in the coolant so that the coolant circulates between the immersion tank and a heat exchanger.

In addition, a technique of cooling a room without using electricity by transporting heat of the room to the outside using a heat pipe has been proposed.

From the viewpoint of energy saving, a further reduction in electric power used in the data center is required. In the immersion cooling method, a pump consumes a relatively large amount of electric power because the pump is used to circulate the coolant between the immersion tank and the heat exchanger.

The followings are reference documents.
[Document 1] International Publication Pamphlet No. WO 2016/031781 and
[Document 2] Japanese Patent Laid-Open Publication No. 05-322459.

SUMMARY

According to an aspect of the invention, a cooling system includes an immersion tank that includes a liquid coolant sealed therein, a housing that includes through-holes formed in a top portion and a bottom portion thereof, respectively, and disposed within the immersion tank, an electronic device disposed in the housing in a state of being immersed in the coolant, a coolant flow path formed between an inner surface of the immersion tank and an outer surface of the housing to couplet he through-hole in the top portion of the housing to the through-hole in the bottom portion of the housing so that the coolant flows therethrough, and a heat transfer member that transports heat of the coolant in the coolant flow path to an outside of the immersion tank.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, embodiments will be described with reference to the accompanying drawings.

First Embodiment

Figure 1:
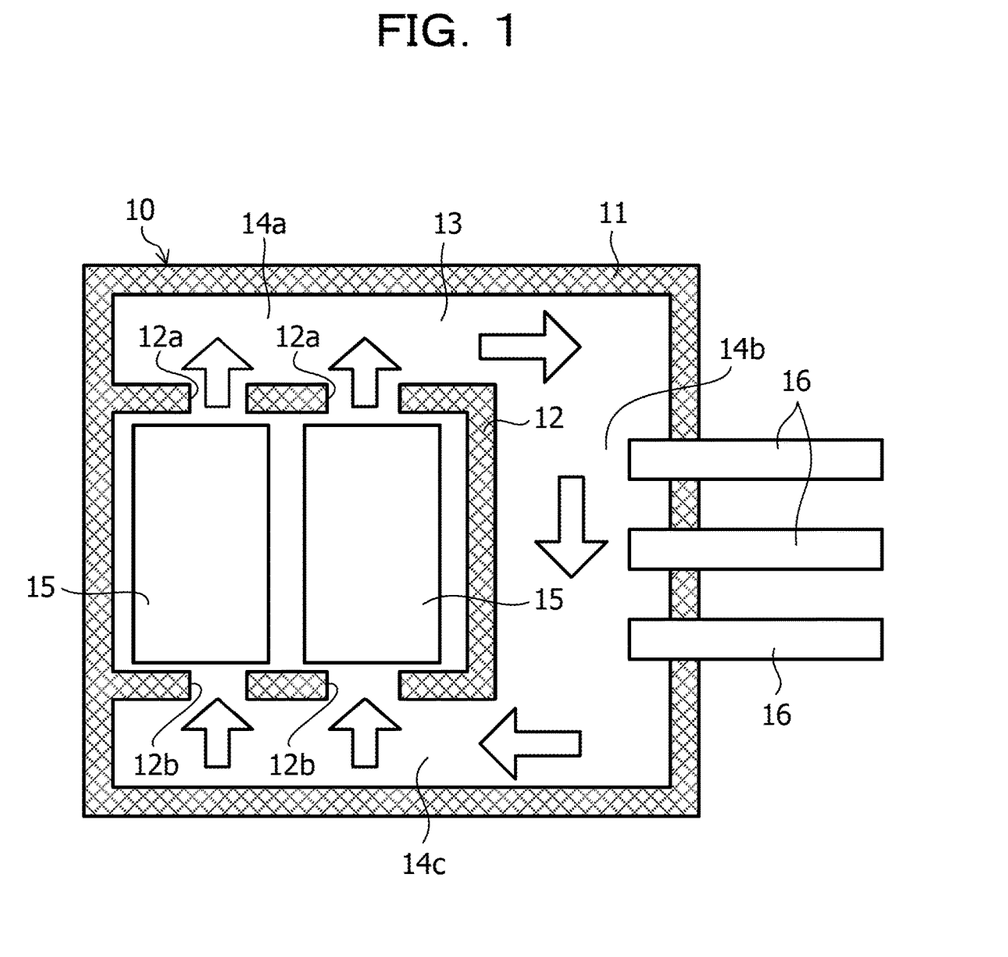
FIG. 1 is a schematic view illustrating a cooling system according to a first embodiment.

FIG. 1 is a schematic view illustrating a cooling system according to a first embodiment.

As illustrated in FIG. 1, the cooling system 10 according to the present embodiment includes an immersion tank 11 having a sealed space and a housing 12 disposed in the immersion tank 11. Through-holes 12a and 12b are formed in the top portion and bottom portion of the housing 12, respectively.

The immersion tank 11 is filled with a coolant 13, and electronic devices 15 are arranged inside the housing 12 in a state of being immersed in the coolant 13. The electronic devices 15 are, for example, servers or storage devices.

The coolant 13 is an inert insulating liquid. As the coolant 13, for example, a fluorine compound such as, for example, 3M™ Fluorinert™, Solvay Golden®, or Asahi Glass Co., Ltd. Asahiklin®. In addition, as the coolant 13, an oil such as, for example, a mineral oil or polyalphaolefin (PAO) may be used.

The immersion tank 11 and the housing 12 are formed to have a high resistance to the coolant 13 and a high heat insulating property. In the present embodiment, the immersion tank 11 and the housing 12 are formed by a resin plate having a hollow double structure. The immersion tank 11 and the housing 12 may be formed, for example, by a member having a structure in which a heat insulator is interposed between two resin plates.

As illustrated in FIG. 1, coolant flow paths, through which the coolant 13 flows, are formed above, below, and on a lateral side of the housing 12. For the convenience of description, the coolant flow path above the housing 12 will be referred to as a flow path 14a, the coolant flow path on the lateral side of the housing 12 will be referred to as a flow path 14b, and the coolant flow path below the housing 12 will be referred to as a flow path 14c. The flow path 14a is connected to the flow path 14b, and the flow path 14b is connected to the flow path 14c.

In the side wall of the immersion tank 11 that is in contact with the flow path 14b, a plurality of heat pipes 16 is arranged through the side wall.

Figure 2:
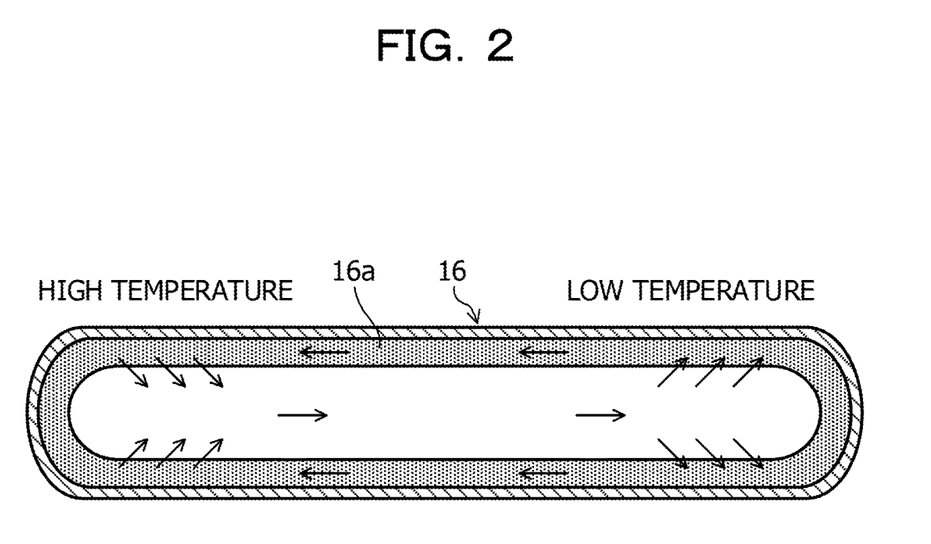
FIG. 2 is a schematic cross-sectional view illustrating a structure of a heat pipe.

FIG. 2 is a schematic cross-sectional view illustrating a structure of a heat pipe.

As illustrated in FIG. 2, the heat pipe 16 is a hollow cylindrical member, opposite ends of which are closed, and the exterior side thereof is formed by a material having a high thermal conductivity such as, for example, copper or aluminum. In addition, a hydraulic fluid is sealed in the heat pipe 16, and the space inside the heat pipe 16 is depressurized in order to facilitate the evaporation of the hydraulic fluid. As the hydraulic fluid, for example, water or alcohol is used.

A wick 16a is provided on the inner wall of the heat pipe 16. The wick 16a serves to cause a capillary phenomenon, and is formed of, for example, a porous film that is formed with fine irregularities or aggregates of particles.

In the heat pipe 16 having such a structure, when one side thereof in the longitudinal direction is disposed on the high temperature side and the other side thereof is disposed on the low temperature side, the hydraulic fluid evaporates on the high temperature side, and is turned into a gas. At this time, the hydraulic fluid takes away evaporation heat from the surroundings.

The hydraulic fluid, which has been turn into the gas on the high temperature side, passes through the center of the heat pipe 16 and moves to the low temperature side. Then, the hydraulic fluid is cooled and condensed on the low temperature side to thereby and is turned into a liquid. At this time, the hydraulic fluid releases condensation heat. The hydraulic fluid, which has been turned into the liquid on the low temperature side, moves to the high temperature side through the wick 16a due to the capillary phenomenon.

In FIG. 2, arrows indicate the direction of movement of the hydraulic fluid. In this way, the hydraulic fluid moves between one side (high temperature side) and the other side (low temperature side) in the heat pipe 16 while repeating evaporation (vaporization) and condensation (liquefaction), thereby transporting heat from one side to the other side.

The heat pipe 16 is an example of a heat transfer member. Although not illustrated in FIG. 2, a heat absorbing member (e.g., fins) may be attached to one side of the heat pipe 16, and a heat radiation member (e.g., fins) may be attached to the other side.

In the present embodiment, the immersion tank 11 is installed outdoors. In this case, the heat transported to the outside of the immersion tank 11 by the heat pipe 16 is dissipated into the atmosphere. In the case of the cooling system 10 according to the present embodiment, the heat pipe 16 may be disposed so as not to directly receive sunlight.

In addition, the heat transported to the outside of the immersion tank 11 by the heat pipe 16 may be dissipated into the water. For example, when the immersion tank 11 is provided in the running water, the heat dissipation effect is further improved. In addition, the immersion tank 11 may be provided in a water storage facility such as a pool.

Hereinafter, the operation of the cooling system 10 according to the present embodiment will be described with reference to FIG. 1. In addition, in FIG. 1, white arrows indicate the direction of movement of the coolant 13.

With the operation of the electronic device 15, heat is generated in the electronic device 15. As the heat is transferred to the coolant 13 around the electronic device 15, the electronic device 15 is cooled and the temperature of the coolant 13 increases.

In addition, because the coolant 13 such as, for example, a fluorine compound or an oil used in the immersion cooling method has a large heat capacity, a large amount of heat is transferred from the electronic device 15 to the coolant 13. Therefore, the immersion cooling method may efficiently cool the electronic device 15, compared to a cooling method using air (air cooling method).

The coolant 13 expands as the temperature thereof increases, and thus is reduced in density. Therefore, the coolant 13, which is heated to a high temperature by the electronic device 15, moves upward in the housing 12, thereby moving to the flow path 14a above the housing 12 through the holes 12a.

As the coolant 13 in the housing 12 moves to the flow path 14a, the low-temperature coolant 13 is introduced into the housing 12 from the flow path 14c through the holes 12b.

When the amount of the high-temperature coolant 13 heated by the electronic device 15 is increased, some of the high-temperature coolant 13 moves from the flow path 14a to the flow path 14b. Therefore, the temperature of the coolant 13 in the vicinity of the heat pipe 16 increases.

As described above, the heat pipe 16 transports heat from the high temperature side to the low temperature side. Therefore, when the temperature of the coolant 13 in the vicinity of the heat pipe 16 becomes a certain degree or more, heat of the coolant 13 is transported from the flow path 14b to the outside of the immersion tank 11 by the heat pipe 16, and is finally dissipated into the atmosphere. Meanwhile, as the heat pipe 16 transports heat, the temperature of the coolant 13 in the vicinity of the heat pipe 16 decreases.

The coolant 13, the temperature of which has decreased, shrinks and is increased in density, thereby moving downward. Then, the coolant 13 moves from the flow path 14b to the flow path 14c, and is introduced from the flow path 14c into the housing 12 through the hole 12b.

In this manner, the natural convection of the coolant 13 occurs in the immersion tank 11 so that the coolant 13 sequentially passes, from the inside of the housing 12, through the flow path 14a, the flow path 14b, and the flow path 14c, and returns into the housing 12.

As described above, in the cooling system 10 according to the present embodiment, because the electronic device 15 is cooled by being immersed in the liquid coolant 13, the efficiency of cooling is high and it is possible to cope with an electronic device 15 having a large calorific value.

In addition, in the cooling system 10 according to the present embodiment, natural convection of the coolant 13 occurs in the immersion tank 11, and the heat generated in the electronic device 15 is moved to the heat pipe 16 by the natural convection, and then is transported to the outside of the immersion tank 11 by the heat pipe 16 to thereby be dissipated into the atmosphere. Thus, a facility such as, for example, a pump for circulating the coolant 13 or a chiller for cooling the coolant 13 is unnecessary. Therefore, according to the present embodiment, the electric power required for the cooling of the electronic device 15 may be remarkably reduced.

Moreover, since the facilities such as the pump and the chiller generates noise as they operate, measures against noise may be required. However, in the cooling system 10 according to the present embodiment, since the facilities are not required, measures against noise are not required.

(Modification)

Although the case where the heat transfer member is the heat pipe has been described in the first embodiment in the first embodiment, a heat siphon or a heat sink may be used as the heat transfer member.

Figure 3:
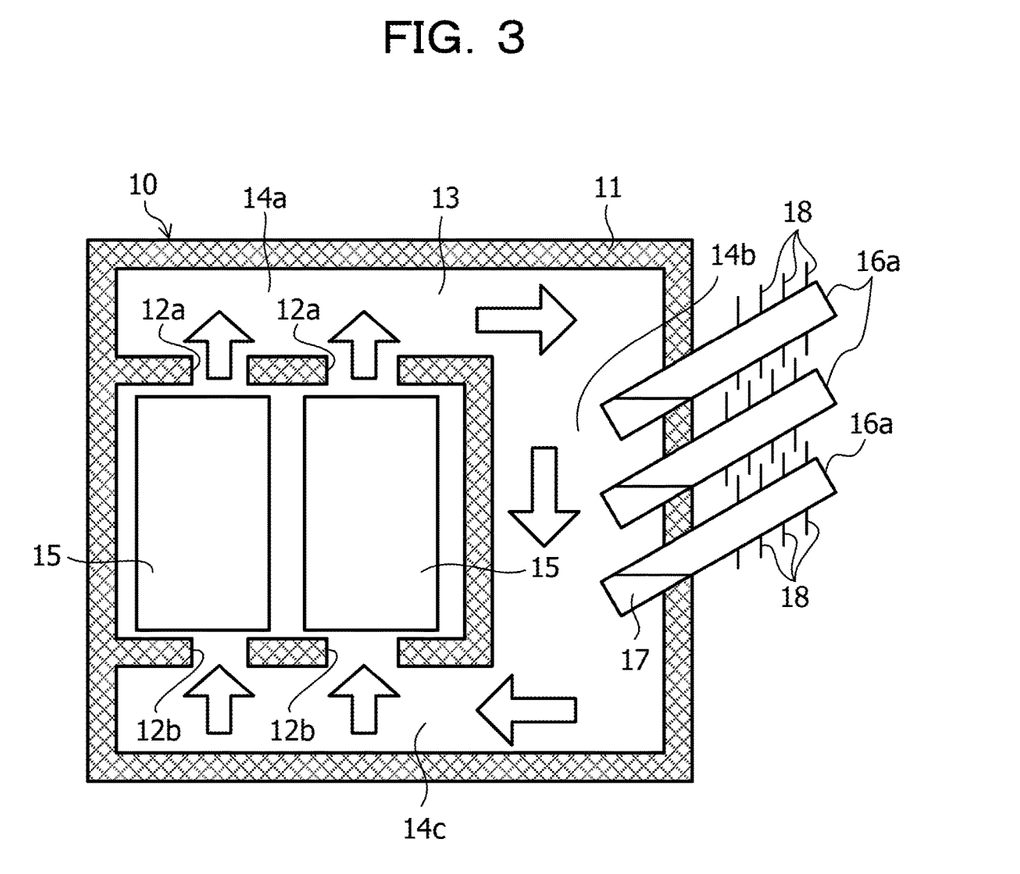
FIG. 3 is a schematic view illustrating an example of a cooling system that uses a heat siphon as a heat transfer member.

FIG. 3 is a schematic view illustrating an exemplary cooling system that uses a heat siphon 16a as the heat transfer member. In FIG. 3, the same reference numerals will be given to the same elements as those in FIG. 1.

The heat siphon 16a is a hollow cylindrical member, opposite ends of which are dosed, and the exterior side thereof is formed of a material having a high thermal conductivity such as, for example, copper or aluminum. A hydraulic fluid 17 is sealed in the heat siphon 16a, and the space inside the heat siphon 16a is depressurized in order to facilitate the evaporation of the hydraulic fluid 17. The heat siphon 16a is disposed such that the lower end side thereof is the high temperature side and the upper end side thereof is the low temperature side.

In the cooling system 10 illustrated in FIG. 3, a plurality of heat siphons 16a is obliquely disposed in the side wall of the immersion tank 11 that is in contact with the flow path 14b so as to penetrate the side wall 11. In addition, a plurality of heat radiation fins 18 is provided on the upper end side of the heat siphon 16a (at the outside of the immersion tank 11).

The hydraulic fluid 17 is heated by the coolant 13, which passes through the flow path 14b, and is thus turned into a gas, and the hydraulic fluid 17, which has been turned into the gas, moves upward in the inner space. Then, the vapor of the hydraulic fluid 17 is cooled on the upper end side of the heat siphon 16a, and is thus turned into a liquid, and the hydraulic fluid 17, which has been turned into the liquid, moves downward by gravity along the inner wall surface of the heat siphon 16a.

In this manner, in the heat siphon 16a, the hydraulic fluid 17 moves between the lower end side (high temperature side) and the upper end side (low temperature side) while repeating evaporation and condensation, thereby transporting heat from the lower end side to the upper end side.

In the cooling system 10 illustrated in FIG. 3, similar to the cooling system 10 illustrated in FIG. 1, the natural convection of the coolant 13 occurs in the immersion tank 11 by the heat generated in the electronic device 15. Then, the heat generated in the electronic device 15 is moved to the heat siphon 16a by the natural convection, and then is transported to the outside of the immersion tank 11 by the heat siphon 16a so that the heat is dissipated into the atmosphere.

Therefore, because facilities such as a pump for circulating the coolant 13 and a chiller for cooling the coolant 13 are unnecessary, electric power required for the cooling of the electronic device 15 may be remarkably reduced.

Figure 4:
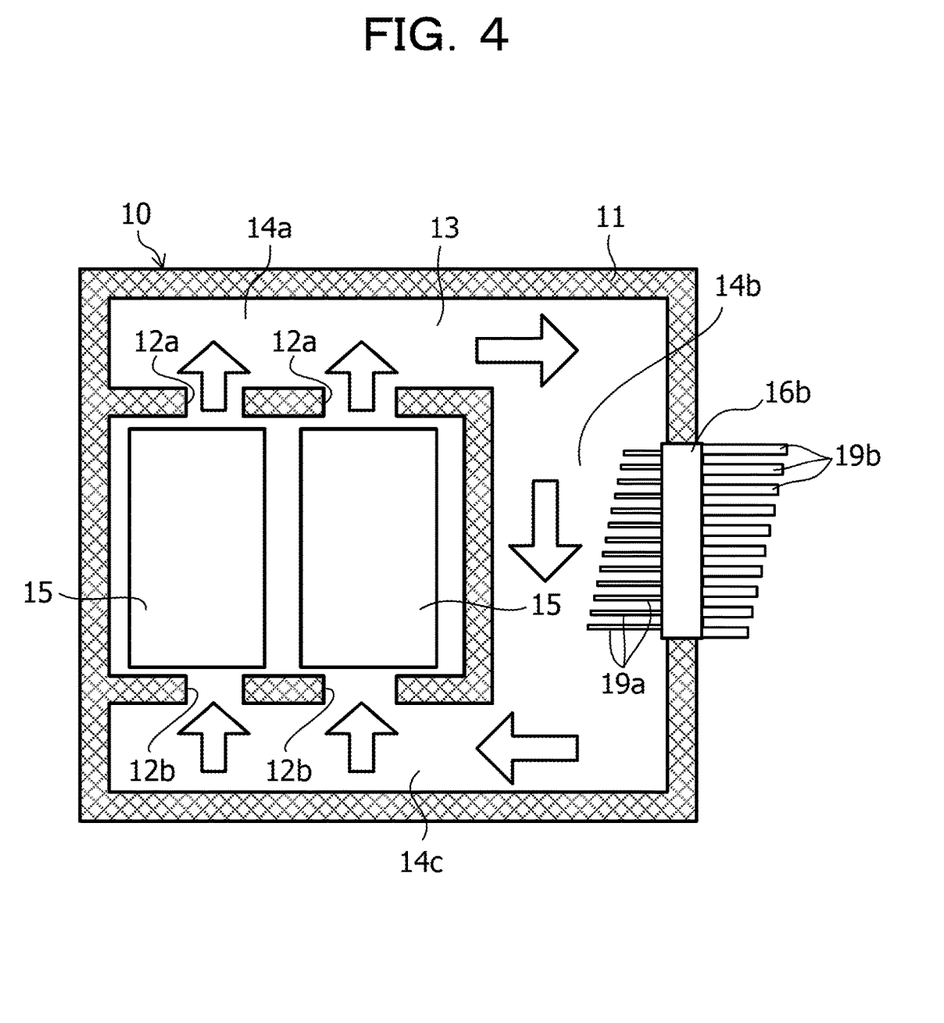
FIG. 4 is a schematic view illustrating an example of a cooling system that uses a heat sink as a heat transfer member.

FIG. 4 is a schematic view illustrating an exemplary cooling system that uses a heat sink 16b as the heat transfer member.

In the cooling system 10 illustrated in FIG. 4, the heat sink 16b is disposed in the side wall of the immersion tank 11 that is in contact with the flow path 14b. The heat sink 16b is formed of a material having a high thermal conductivity such as copper or aluminum, and a plurality of heat-absorbing fins 19a is provided on one side of the heat sink 16b to be in contact the coolant 13, which passes through the flow path 14b. In addition, the other side of the heat sink 16b is exposed to the outside of the immersion tank 11 and is provided with a plurality of heat radiation fins 19b.

The heat of the coolant 13, which passes through the flow path 14b, moves to the outside of the immersion tank 11 via the heat sink 16b and is dissipated into the atmosphere.

Even in the cooling system 10 illustrated in FIG. 4, the natural convection of the coolant 13 occurs in the immersion tank 11 by the heat generated in the electronic device 15. Then, the heat generated in the electronic device 15 is moved to the heat sink 16b by the natural convection, and then is transported to the outside of the immersion tank 11 by the heat sink 16b so that the heat is dissipated into the atmosphere.

Therefore, because facilities such as a pump for circulating the coolant 13 and a chiller for cooling the coolant 13 are unnecessary, electric power required for the cooling of the electronic device 15 may be remarkably reduced.

Second Embodiment

Figure 5:
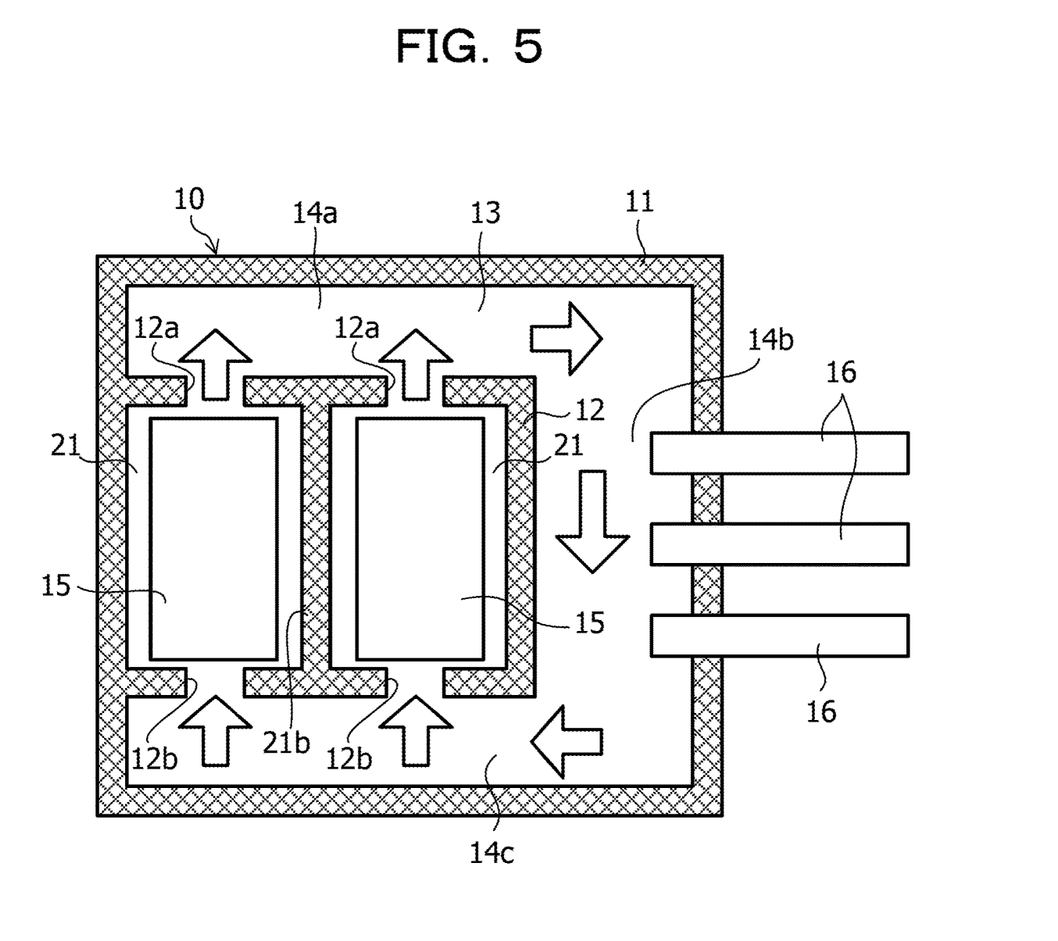
FIG. 5 is a schematic view illustrating a cooling system according to a second embodiment.

FIG. 5 is a schematic view illustrating a cooling system according to a second embodiment. In FIG. 5, the same reference numerals will be given to the same elements as those in FIG. 1, and a detailed description thereof will be omitted.

In the present embodiment, as illustrated in FIG. 5, the inside of the housing 12 is divided into a plurality of chambers 21 by partitions 21a, and one electronic device 15 is disposed in each of these chambers 21. That is, in the present embodiment, a plurality of electronic devices 15 is dispersively arranged in the plurality of chambers 21.

A hole 12a is formed at the upper side of each chamber 21 so as to connect the chamber 21 with the flow path 14a, and a hole 12b is formed at the lower side of the chamber 21 so as to connect the chamber 21 with the flow path 14c.

In the first embodiment, because the plurality of electronic devices 15 is disposed in the housing 12 having no partition, the convection of the coolant 13 occurs in the housing 12 when the electronic devices 15 have a large calorific value. When the convection of the coolant 13 occurs in the housing 12, the temperature of the coolant 13 in the housing 12 increases, which causes deterioration in the cooling efficiency of the electronic device 15.

However, in the present embodiment, even if a difference in the calorific values of the respective electronic devices 15, each electronic device 15 may be efficiently cooled because the coolant 13 moves in a given direction from the bottom portion to the top portion in each chamber 21.

In addition, although one electronic device 15 is disposed in each chamber 21 in the present embodiment, a plurality of electronic devices 15 having substantially the same calorific values may be disposed in one chamber 21.

(Modification)

Figure 6:
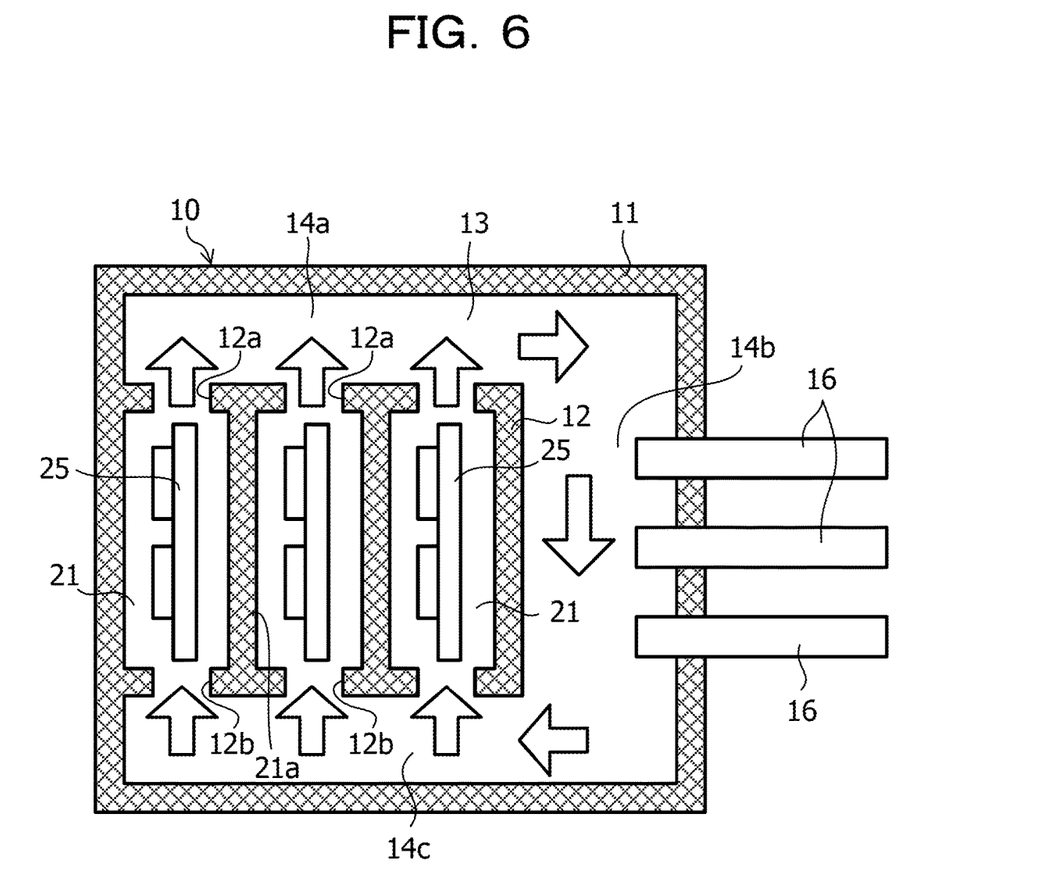
FIG. 6 is a schematic view illustrating a modification of the second embodiment.

FIG. 6 is a schematic view illustrating a modification of the second embodiment. In FIG. 6, the same reference numerals will be given to the same elements as those in FIG. 5.

In the cooling system 10 illustrated in FIG. 6, printed boards 25, on which central processing units (CPU) and other electronic elements are mounted, are disposed, as electronic devices, in the respective chambers 21. The printed boards 25 may come into contact with the wall of the chambers 21, or may be fixed to the walls of the chambers 21.

Third Embodiment

Figure 7:
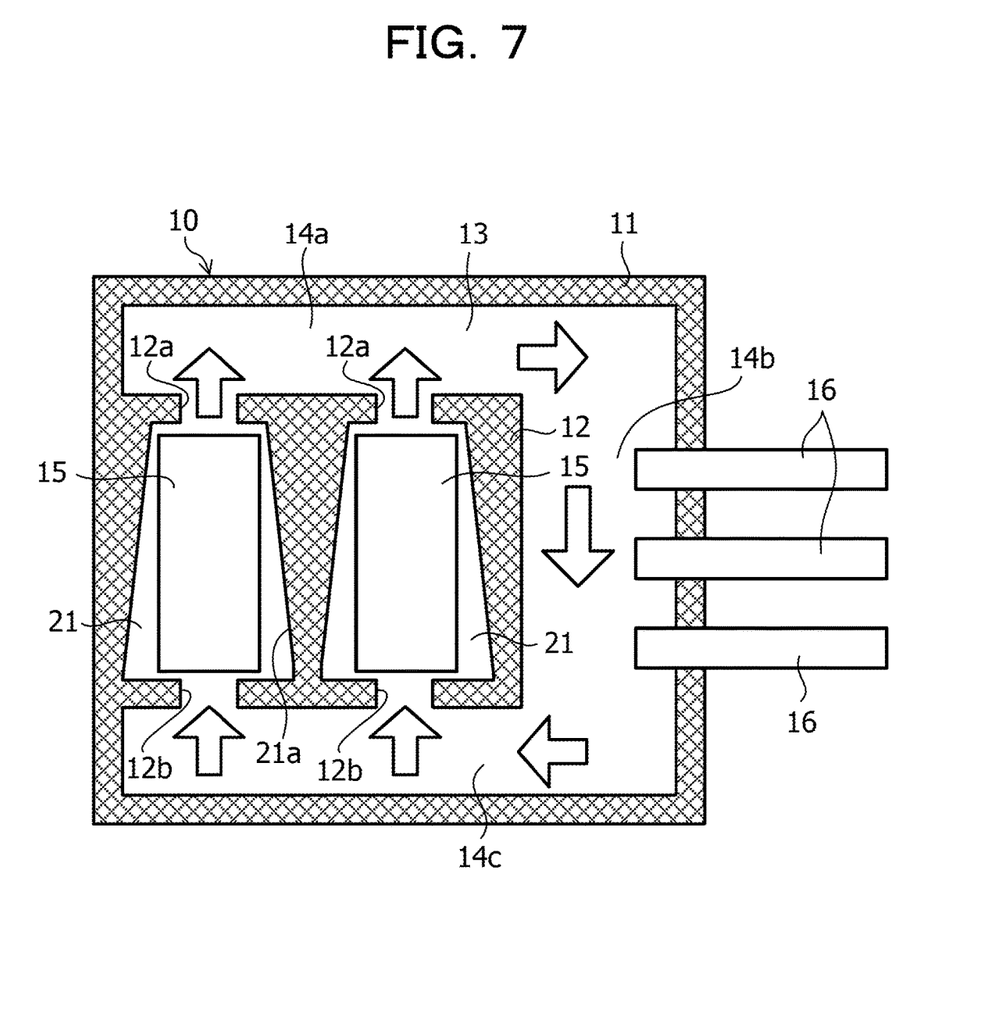
FIG. 7 is a schematic view illustrating a cooling system according to a third embodiment.

FIG. 7 is a schematic view illustrating a cooling system according to a third embodiment. In FIG. 7, the same reference numerals will be given to the same elements as those in FIG. 1, and a detailed description thereof will be omitted.

In the present embodiment, similar to the second embodiment, the inside of the housing 12 is divided into a plurality of chambers 21 by partitions 21a. However, in the present embodiment, each chamber 21 has a truncated quadrangular pyramidal shape and is wider on the lower side and narrower on the upper side. In each chamber 21, one electronic device 15 is disposed in a corresponding chamber 21.

The coolant 13, which is heated by the electronic device 15, moves from the bottom portion to the top portion inside the chamber 21, and the flow rate of the coolant 13 varies depending on the cross-sectional area of the chamber 21 (the area of the plane parallel to the horizontal plane). That is, the flow rate of the coolant 13 is slower at the lower side of the chamber 21 and the flow rate of the coolant 13 becomes faster as it goes upward. Then, the coolant 13 vigorously flows out from the hole 12a to the flow path 14a.

In the case of the second embodiment illustrated in FIG. 5, the convection for the circulation of the coolant 13 in the chamber 21 may occur depending on the calorific value of the electronic device 15 and the size of the hole 12a. When the convection of the coolant 13 occurs in the chamber 21, the temperature of the coolant 13 increases in the chamber 21, which causes deterioration in the cooling efficiency of the electronic device 15.

However, in the present embodiment, because the chamber 21 has a truncated quadrangular pyramidal shape, as described above, the flow rate of the coolant 13 increases as the coolant 13 moves upward to the upper side of the chamber 21, and the coolant 13 vigorously flows out from the hole 12a to the flow path 14a. Therefore, the convection of the coolant 13 is less likely to occur in the chamber 21, and deterioration in the cooling efficiency of the electronic device 15 due to the convection of the coolant 13 in the chamber 21 may be avoided.

(Modification)

Figure 8:
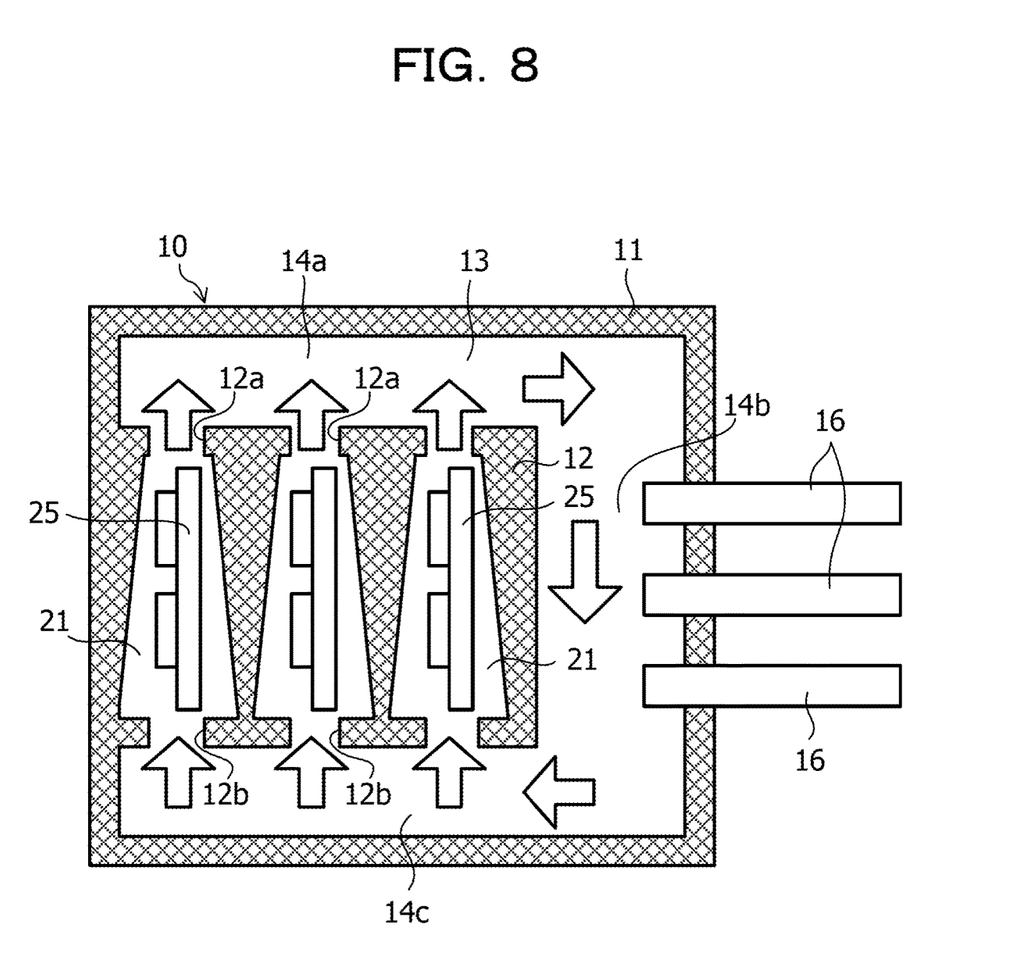
FIG. 8 is a schematic view illustrating a modification of the third embodiment.

FIG. 8 is a schematic view illustrating a modification of the third embodiment. In FIG. 8, the same reference numerals will be given to the same elements as those in FIG. 7.

In the cooling system 10 illustrated in FIG. 8, the printed boards 25 on which CPUs and other electronic elements are mounted are disposed as electronic devices in the respective chambers 21. The printed boards 25 may be in contact with the walls of the chambers 21, or may be fixed to the walls of the chambers 21.

Fourth Embodiment

Figure 9:
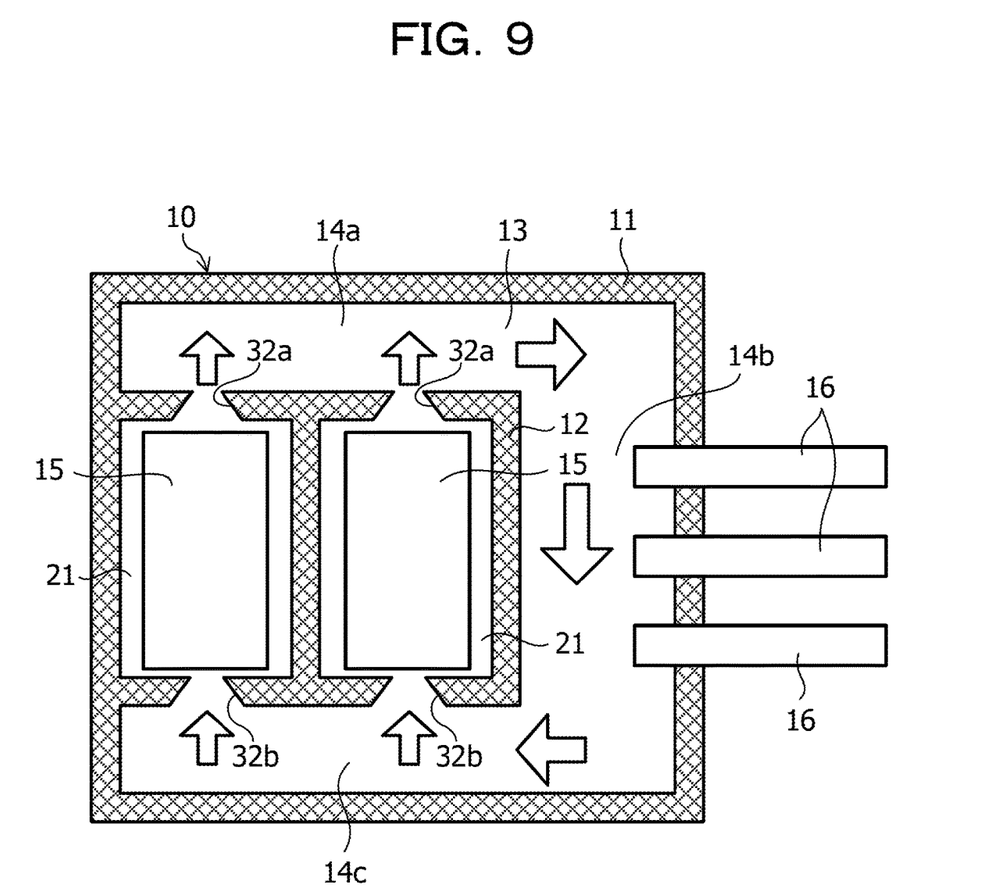
FIG. 9 is a schematic view illustrating a cooling system according to a fourth embodiment.

FIG. 9 is a schematic view illustrating a cooling system according to a fourth embodiment. In FIG. 9, the same reference numerals will be given to the same elements as those in FIG. 5, and a detailed description thereof will be omitted.

In the present embodiment, similar to the second embodiment, the inside of the housing 12 is divided into a plurality of chambers 21 by partitions 21a. In addition, one electronic device 15 is disposed in a corresponding chamber 21.

A through-hole 32a is formed at the upper side of each chamber 21 so as to connect the chamber 21 with the flow path 14a, and a through-hole 32b is formed at the lower side of each chamber 21 so as to communicate the chamber 21 with the flow path 14c. Both the holes 32a and 32b have a truncated conical shape or a truncated quadrangular pyramidal shape, and are wider at the lower side and narrower at the upper side thereof.

In the present embodiment, as described above, each of the holes 32a, which connect the chambers 21 with the flow path 14a, and the holes 32b, which connect chambers 21 with the flow path 14c, has a conical shape. Therefore, the flow rate of the coolant 13 is slower at the lower sides of the holes 32a and 32b, and the flow rate of the coolant 13 becomes faster with decreasing distance to the upper sides of the holes 32a and 32b. Thus, the coolant 13, which is introduced from the flow path 14c into the chamber 21, to hardly returns to the flow path 14c, and the coolant 13, which is introduced from the chamber 21 into the flow path 14a, hardly returns to the chamber 21.

Thereby, the convection of the coolant 13 flowing from the housing 12 (each chamber 21) and returning into the housing 12 through the flow path 14a, the flow path 14b, and the flow path 14c becomes smoother.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:
1. A cooling system comprising:
an immersion tank that includes a liquid coolant sealed therein;
a housing that includes through-holes formed in a top portion and a bottom portion thereof, respectively, and disposed within the immersion tank;
an electronic device disposed in the housing in a state of being immersed in the coolant;
a coolant flow path formed between an inner surface of the immersion tank and an outer surface of the housing to couple the through-hole in the top portion of the housing to the through-hole in the bottom portion of the housing so that the coolant flows therethrough; and
a heat pipe arranged through a side wall of the immersion tank, the heat pipe is a hollow cylindrical member, opposite ends of which are closed,
a hydraulic fluid is sealed in the heat pipe, and
the hydraulic fluid transports heat of the coolant in the coolant flow path to an outside of the immersion tank.
2. The cooling system according to claim 1, wherein both the immersion tank and the housing are configured with a heat insulating member.
3. The cooling system according to claim 1, wherein the housing has a space therein that is divided into a plurality of chambers by partitions, and a plurality of electronic devices is dispersively arranged in the plurality of chambers.
4. The cooling system according to claim 3, wherein the plurality of chambers has a conical shape having a wider lower side and a narrower upper side.

5. The cooling system according to claim 3, wherein the through-holes in the top portion and the bottom portion of the housing have a conical shape having a wider lower side and a narrower upper side.

6. The cooling system according to claim 1, wherein the electronic device is a server or a storage device.

7. The cooling system according to claim 1, wherein the heat transported to an outside of the immersion tank by the heat pipe is dissipated to an atmosphere.

8. A method of cooling an electronic device, comprising:
disposing a housing having through-holes formed in a top portion and a bottom portion thereof, respectively, in a sealed immersion tank, and disposing an electronic device in the housing so that an inside of the immersion tank is filled with a liquid coolant;
generating, by heat generated in the electronic device, natural convection of the coolant that is discharged out of the housing from the through-hole in the top portion of the housing, passes through a coolant flow path between an outer surface of the housing and an inner surface of the immersion tank, and returns to an inside of the housing from the through-hole in the bottom portion of the housing; and
transporting, by a heat pipe, heat of the coolant that passes through the coolant flow path to an outside of the immersion tank,
the heat pipe is arranged through a side wall of the immersion tank,
the heat pipe is a hollow cylindrical member, opposite ends of which are closed,
a hydraulic fluid is sealed in the heat pipe, and
the hydraulic fluid transports heat of the coolant in the coolant flow path to an outside of the immersion tank.

\* \* \* \* \*